United States Patent [19]

Coombes et al.

[11] Patent Number: 4,600,480
[45] Date of Patent: Jul. 15, 1986

[54] METHOD FOR SELECTIVELY PLATING PLASTICS

[75] Inventors: Robert L. Coombes, La Canada Flintridge; Kay Huesken, Monrovia, both of Calif.

[73] Assignee: Crown City Plating, El Monte, Calif.

[21] Appl. No.: 732,100

[22] Filed: May 9, 1985

[51] Int. Cl.$^4$ .............................................. C25D 5/54
[52] U.S. Cl. ........................................ 204/20; 204/15;
204/40; 204/41; 204/49; 204/52 R; 204/51;
204/38.4; 427/300; 427/304; 427/305;
252/79.2; 156/901; 156/902
[58] Field of Search ...................... 204/20, 15, 22, 30,
204/48, 49, 52 RY, 51, 38 B, 40–41, 146, 228,
289; 427/300, 304–305; 252/79.1–79.5;
156/901, 902

[56] References Cited

U.S. PATENT DOCUMENTS

| | | | |
|---|---|---|---|
| 3,240,684 | 3/1966 | Martin et al. | 156/901 |
| 3,620,933 | 11/1971 | Grunwald et al. | 204/30 |
| 3,682,784 | 8/1972 | Ryan et al. | 204/30 |
| 4,104,111 | 8/1978 | Mach | 156/902 |
| 4,312,897 | 1/1982 | Reimann | 156/902 |
| 4,487,654 | 12/1984 | Coppin | 156/902 |

OTHER PUBLICATIONS

"Plating on Plastics", by Müller et al, 2nd ed, Robert Draper Ltd., 1971, pp. 126–127.

Primary Examiner—R. L. Andrews
Attorney, Agent, or Firm—Christie, Parker & Hale

[57] ABSTRACT

A method for plating first selected surfaces of a platable plastic substrate without plating second selected surfaces is disclosed. The method comprises first electrolessly plating the substrate to provide an electroless metal layer over all of the first selected surfaces and at least a portion of the second selected surfaces. The substrate is then mounted on an electroplating rack so that the current density at the second selected surfaces is lower during electroplating than at the first selected surfaces. The substrate is then electroplated to provide one or more intermediate metal layers which extends over at least all of the first selected surfaces and then electroplated with a final metal different from the metals of the electroless and intermediate layers at a voltage whereby the final metal deposits over the first selected surfaces but not over the second selected surfaces. The electroplated substrate is then immersed in a stripping solution which dissolves the electroless and intermediate metals but not the final metal for a time sufficient to dissolve the electroless and intermediate metals covering the second selected surfaces.

19 Claims, 7 Drawing Figures

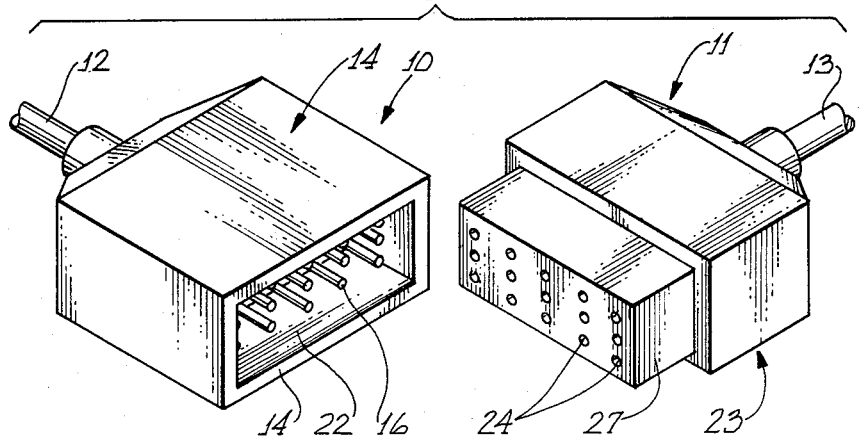
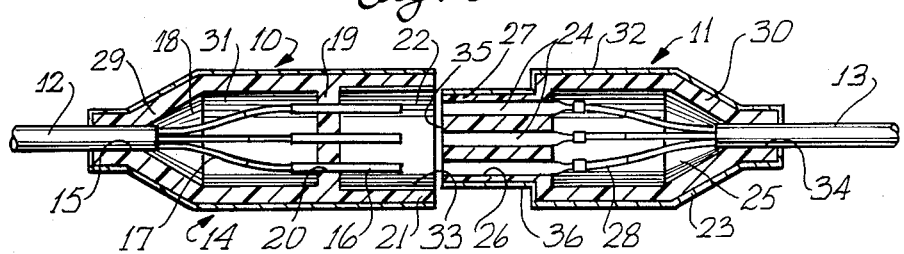
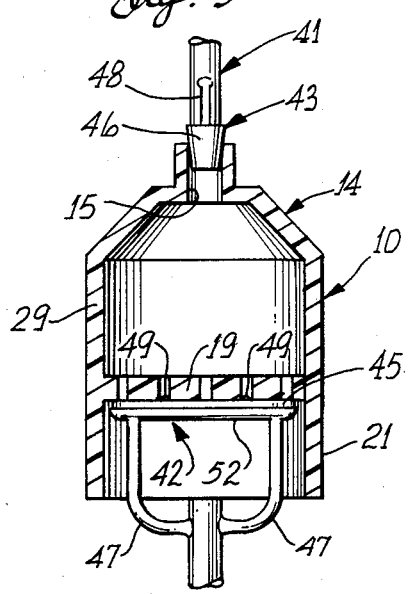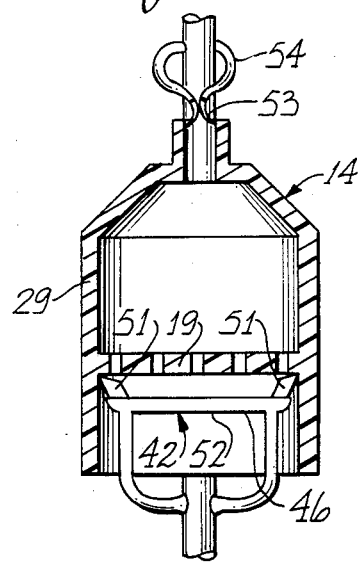

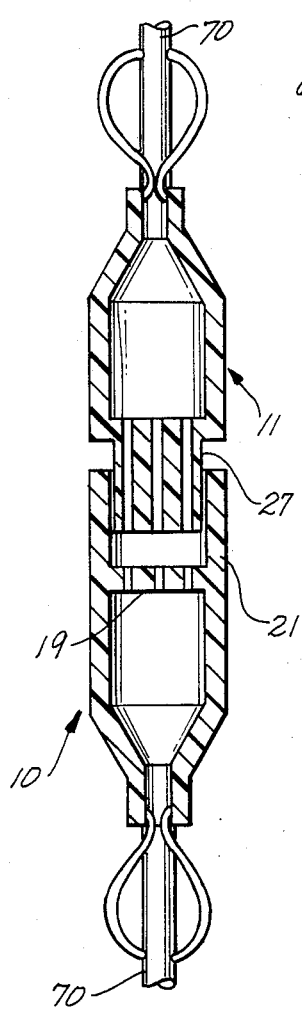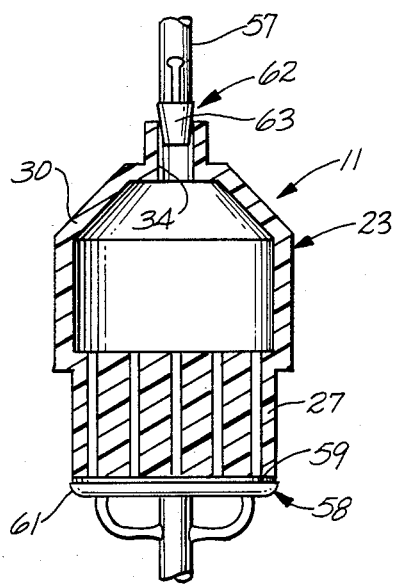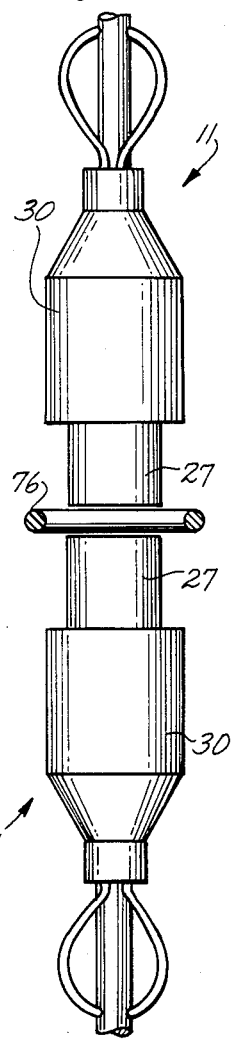

METHOD FOR SELECTIVELY PLATING PLASTICS

FIELD OF THE INVENTION

This invention relates to a method for plating plastic substrates and more particularly to a method for plating certain selected surfaces of a plastic substrate without plating other selected surfaces.

BACKGROUND OF THE INVENTION

In conventional processes for plating plastic substrates, a thin first layer of metal, such as copper or nickel, is chemically deposited over the surface of the substrate in an electroless plating process. The electrolessly deposited layer is then used as a buss to build up a thicker metal coating over the substrate in an electrolytic plating process.

If it is desired that certain areas or surfaces of the part remain unplated, those surfaces must be masked at least during the electroless plating process. This can be done in various ways. For example, tape or some other adhesive can be applied to the surfaces which are not to be plated. Such a procedure, however, is generally limited to flat surfaces over which the tape can be applied. For more complex surfaces, a chemical resist is generally preferred.

Chemical resists are non-typically, non-conductive, non-platable material which can be applied to the surface of the plastic substrates as a liquid, for example by brush or spray painting techniques, and which, when dried, will resist plating, i.e., will not be plated, in the electroless plating process. That is, only the surfaces of the substrate which do not receive the resist will be plated. After the substrate has been plated, the resist can be stripped off, if desired, by an appropriate solvent.

While the use of non-platable chemical resists is effective, it is expensive. In addition to the cost of the chemical resist material itself, expense is incurred as a result of the time, effort and, in some instances, equipment required to apply the resist to the substrate. Accordingly, there is a need for a method for selectively plating plastic substrates without the use of chemical resists or other masks.

SUMMARY OF THE INVENTION

Accordingly, this invention provides a method for plating first selected surfaces of a plastic substrate without plating other second selected surfaces of the substrate and without the use of a chemical resist. The method comprises first electrolessly plating the plastic substrate to provide a layer of a first metal, preferably copper or nickel, over the substrate, including substanially all of the surfaces over which a conductive coating is desired, i.e., the first selected surfaces, and at least a portion of the surface over which a conductive coating is not desired, i.e., the second selected surfaces.

The electrolessly plated substrate is then mounted onto an electroplating rack so that, during subsequent electroplating, i.e., electrolytic deposition, the current density is lower at the second selected surfaces than at the first selected surfaces. The electroless plated substrate is then electroplated with a second metal different from the first metal under conditions whereby the second metal deposits over the first selected surfaces, but does not deposit onto the second selected surfaces.

The electroplated substrate is then immersed in a stripping solution capable of dissolving the first metal but not the second metal for a time sufficient to dissolve the first metal layer which is exposed on the second selected surfaces.

In a preferred embodiment of the invention, a plastic substrate having first selected surfaces over which it is desired to have a conductive coating and second selected surfaces over which no conductive coating is desired is first electrolessly plated preferably with copper or nickel by a conventional electroless plating process. In the process, an initial layer of copper or nickel deposits onto the substrate over all of the first selected surfaces and at least a portion of the second selected surfaces. The electrolessly plated substrate is then mounted onto an electroplating rack so that during electrolytic deposition, the current density at the second selected surfaces is lower than at the first selected surfaces.

The electrolessly plated substrate is then electroplated with one or more intermediate layers of metal, preferably copper and/or nickel, over at least all of the first selected surfaces. The substrate is then electroplated with a final layer of metal different from the metals of the electroless layer and the intermediate electroplated layers under conditions whereby the final deposits over the first selected surfaces of the substrate but not over the second selected surfaces. Preferred final metal layers comprise chromium and black chromium.

The electroplated substrate is then immersed in a stripping solution which dissolves the initial electroless layer and the intermediate electrolytic layers over the second selected surfaces which are not covered by the final metal layer but does not dissolve the final metal and the layers underlying the final metal layer.

In a particularly preferred embodiment of the invention, the electrolessly plated substrate is mounted on an electroplating rack comprising at least one shield which is positioned adjacent a second selected surface so that, during the electrolytic deposition, the current density at the second selected surface is lower than at the first selected surfaces. The substrate is then electrolytically plated, the final metal layer being electrolytically deposited under conditions whereby it deposits over the first selected surfaces but not over the second selected surfaces. The substrate is then immersed in a stripping solution which strips the electroless and any intermediate electrolytic layers which are exposed in the second selected surfaces.

BRIEF DESCRIPTION OF THE DRAWINGS

These and other features and advantages of the present invention will be better understood by reference to the following detailed description when considered in conjunction with the accompanying drawings wherein:

FIG. 1 is a perspective view of exemplary male and female connectors;

FIG. 2 is a side cross-sectional view of the male and female connectors shown in FIG. 1;

FIG. 3 is a top cross-sectional view of a male connector mounted on an electroplating rack showing a preferred method of mounting;

FIG. 4 is a top cross-sectional view of a male connector mounted on an electroplating rack showing another preferred method of mounting;

FIG. 5 is a top cross-sectional view of a female connector mounted on an electroplating rack showing a preferred method of mounting;

FIG. 6 is a side cross-sectional view of male and female connectors mounted on an electroplating rack; and FIG. 7 is a side view of a pair of female connectors mounted on an electroplating rack.

DETAILED DESCRIPTION

This invention is particularly applicable to the manufacture of shielded electrical connectors. With reference to FIGS. 1 and 2, there are shown exemplary male and female electrical connectors 10 and 11 respectively mounted at the ends of shielded electrical cables 12 and 13.

The male connector 10 comprises a contact housing 14 having a hollow interior 18 on which a plurality of electrically conductive metal pins 16 are mounted. The cable 12 comprises a plurality of wires 17 and extends into the interior 18 of the contact housing 14 through a cable opening 15. Each pin 16 is connected within the interior 18 of the contact housing 14 to a separate wire 17 from the cable 12 and extends through a pin hole 20 in a generally rectangular wall or pin plate 19 of the contact housing 14. A guard 21 extends around the periphery of the pin plate 19 and forms a recess 22 in which the pins 16 protrude from the contact housing 14.

The female connector 11 comprises a contact housing 23 having a hollow interior 25 and a plurality of input jacks 24 for receiving the pins 16 of the male connector 10. The input jacks 24 of the female connector 11 lie within input jack holes 26 which extend through a generally rectangular input jack projection 27. The input jacks 24 are connected within the interior of the contact housing 23 with individual wires 28 of cable 13 which extends into the contact housing 23 through cable opening 34. The input jack projection 27 has a size and shape selected to be fittedly inserted into the recess 22 formed by the guard 21 of the male connector 10 so that the pins 16 of the male connector 10 engage the input jacks 24 of the female connector 11.

The contact housings 14 and 23 of the male and female connectors 10 and 11 comprise non-conductive platable plastic bodies or substrates 29 and 30 respectively. The exterior surfaces of the contact housings 14 and 23 also comprise conductive coatings 31 and 32 respectively to reduce interference from electromagnetic emmissions which occur in the environment.

The conductive coating 31 extends over substantially all of the exterior surfaces of the substrate 29 with the exception that it does not contact the pins 16 of the male connector 10. Likewise, the conductive coating 32 extends over substantially all of the exterior surfaces of the substrate 30 with the exception that it does not contact the input jacks 24 of the female connector 11. Electrical contact between the conductive coatings 31 and 32 and the pins 16 or the input jacks 24 is avoided to assure that grounding does not occur and to avoid short circuits between the pins 16 or input jacks 24. To assure that the conductive coating 31 does not contact the pins 16 or the input jacks 24, the pin plate 19 and the end wall 35 of the input jack projection 27 preferably remains uncoated.

It is generally desirable that the conductive coating 31 extend at least part way down the inner surface 33 of the guard 21 to increase the amount of shielding and to assure electrical contact and thereby provide an electrical ground path between the conductive coatings 31 and 32 of the male and female connectors 10 and 11. Likewise, it is generally desirable that the conductive coating 32 extend over the side surfaces 36 of the input jack projection 27.

When the male and female connectors 10 and 11 are assembled, the conductive coating 31 of the male connector 10 contacts the conductive coating 32 of the female connector 11 and forms a continuous electrically conductive coating over the entire assemblage.

The electrically conductive coatings 31 and 32 are applied to the exterior surfaces of the contact housing substrates 29 and 30 by the process of the present invention. In accordance with that process, the plastic substrates 29 and 30 are first electrolessly plated. They are then mounted on an electroplating rack so that the surfaces which are not to have a conductive coating, i.e., second selected surfaces, are at a lower current density during subsequent electroplating than those surfaces which are to receive conductive coating, i.e., the first selected surfaces. The substrates are then electroplated with one or more layers of metal, the final metal layer being electrolytically deposited under conditions which are adjusted so that the final metal deposits on the first selected surfaces but does not deposit on the second selected surfaces. Finally, the electroplated substrates are immersed in a stripping solution capable of dissolving the electroless layer and any electrolytically deposited intermediate layers, but not the final layer, for a time sufficient to dissolve all of the metal covering the second selected surfaces.

Conventional electroless plating processes typically comprise the steps of etching the surface, e.g., with a strong oxidizing acid or base, seeding the surface with a noble metal catalyst, e.g., a palladium chloride solution, then immersing the seeded surface in an autocatalytic electroless plating solution wherein an initial coating of a conductive metal, e.g., copper or nickel, is established by chemical deposition.

Any suitable electroless plating process can be used in the practice of this invention. The particular process which is used will generally depend on the type of plastic from which the substrate is made. Further, there may be more than one process which is useful for a particular type of plastic. For each process there are generally numerous variations which can be practiced to yield a suitable electroless deposit.

Exemplary electroless plating processes useful in the practice of the present invention are those described in U.S. Pat. No. 3,668,130 for acrylonitrile-butadienestyrene (ABS) substrates, U.S. Pat. Nos. 4,309,462, 4,315,045 and 4,335,164 for polyamide substrates, U.S. Pat. No. 4,125,649 for polysulfone substrates, U.S. Pat. No. 4,325,992 for polycarbonate substrates and U.S. Pat. No. 4,325,991 for polyester substrates, all assigned to Crown City Plating Co. of El Monte, Calif., and all of which are incorporated herein by reference.

Deposition of metal onto the surface of the plastic substrate in an electroless plating process generally occurs over the entire surface of the substrate except for those surfaces not in contact with the solutions of the electroless plating process, e.g., because of air entrapment or the like. With respect to the substrates 29 and 30 of the male and female connectors 10 and 11 described above, the face of the pin plate 19 of the male connector 10 as well as the end surface of the input jack projection 27 of the female connector 11 are surfaces on which electroless deposition would normally occur. Further, unless restricted by air entrapment or the like, electroless deposition will also occur in the pin holes 20 of the male connector 10 and the input jack holes 26 of the female connector 11 as well as the interior surfaces of the contact housing substrates 29 and 30.

Following electroless deposition, the electrolessly plated substrates 29 and 30 are mounted on electroplating racks so that the current density during subsequent electroplating at the second selected surfaces of the contact housing substrates 29 and 30, e.g., the pin plate 19, pin holes 20 and interior surfaces of the contact housing substrate 29 of the male connector 10 and the end surface 35 of the input jack projection 27, the input jack holes 26 and the interior surfaces of the contact housing substrate 30 of the female connector 11, is lower than that at the first selected surfaces. In such an arrangement, the conditions, particularly the voltage, during electrolytic deposition of the final metal layer can be adjusted so the the current density at the second selected surfaces is so low that the final metal does not plate on the second selected surfaces.

The substrates 29 and 30 may be mounted on the electroplating rack by various methods, depending on such factors as the configuration of the substrate and the location of the second selected surfaces. For example, if a second selected surface is located in a recess or the like, it may simply be mounted on the electroplating rack in an orientation so that the current density at the second selected surface is lower than at the first selected surface. If, on the other hand, the substrate cannot be mounted on an electroplating rack so that the current density is lower at the second selected surfaces than at the first selected surfaces, a shield may be positioned over or adjacent the second selected surfaces to reduce the current density at those surfaces. The shield may be non-conductive or conductive.

For example, with reference to FIG. 3, the contact housing substrate 29 of the male connector 10 may be mounted on an electroplating rack 41 between a shield 42 in the form of a generally rectangular metal plate 45 which fits inside the guard 21 of the male connector 10 and a shield 43 in the form of a generally conical plug 46, preferably made of a non-conductive material such as rubber, plastic or the like, which extends into the cable opening 15 of the contact housing 14. The shields 42 and 43 are located at the ends of contact wires 47 and 48 which, when the substrate 29 is mounted on the rack 41, bias the shields 42 and 43 toward each other, thereby firmly securing the substrate 29 on the rack.

The shield 42 covers the face of the pin plate 19 and preferably contacts the pin plate 19 as shown. One or more protrusions 49 may extend upwardly from the shield 42 and engage pin holes 20 of the pin plate 19 to minimize movement of the substrate 29 relative to the shield 42. Alternatively, as shown in FIG. 4, the shield 42 may be spaced apart from the pin plate 19 and maintained in that position by contacts 51.

Electroplating racks typically comprise a metal frame coated with a non-conductive coating such as polyvinyl chloride, plastisol or the like. In the embodiment shown in FIG. 3, the frame of the electroplating rack 41, the contact wires 47 and 48 and the shields 42 and 43 are all coated with a non-conductive coating 52. Electrical contact is made between the metal frame of the electroplating rack 41 and the substrate 29 through the contact wires 47 and the upper surface of metal plate 45, the upper surface of the metal plate 45 in contact with the substrate 29 being uncoated. If desired, however, the plug 46 may be made of an electrically conductive material and electrical contact may be made with the substrate 29 through the plug 46 and contact wire 48.

For those substrates having a circular cable opening, such as the substrate 29 in FIG. 3, the use of a conical plug 46 for mounting the substrate on the electroplating rack is particularly preferred because it seals the cable opening 15 and thus prevents air trapped within the interior of the contact housing substrate 29 from escaping. This effectively prevents the substrate from filling with electroplating solution, thereby reducing the amount of electroplating solution carried over into the next bath of the electroplating process. Such a plug need not be used however. For example, as shown in FIG. 4, in lieu of a plug, contacts 53 at the end of flexible coated contact wires 54 may be used.

With reference to FIG. 5, the female connector 11 may be mounted on an electroplating rack 57 between a shield 58, in the form of a generally rectangular metal plate 59 which, covered by a non-conductive coating 61 except for the upper surface, contacts the end surface of the input jack projection 27 and a shield 62 in the form of a generally conical plug 63 which extends into the cable opening 34 of the contact housing 23. Again, while the shield 58 preferably contacts the end surface of the input jack projection 27, it may be spaced apart a short distance from it.

The function of shields 42 and 58 is not to prevent the electroplating solution from contacting the underlying surface of the substrate but rather to assure that the current density during electroplating of the final metal layer is sufficiently low at the underlying surface that no deposition of the final metal occurs on those surfaces.

As an alternative to using shields which are a part of the rack, the substrates 29 and 30 may be mounted on an electroplating rack 70 as shown in FIG. 6 with the input jack projection 27 of the female connector 11 partially inserted into the guard 21 of the male connector 10. In such an arrangement, the guard 21 acts as a shield to prevent electrodeposition on the end surface of the input jack projection 27 of the female connector 11 and the input jack projection 27 acts as a shield for the pin plate 19 of the male connector 11.

In certain circumstances wherein the second selected surfaces are not at a lower current density during electroplating than the first selected surfaces, a conductive shield or "robber" may be placed at a position spaced-apart from the second selected surface to "rob" that surface of current thereby reducing the current density at that surface. The "robber" may be a part of the electroplating rack or another substrate.

For example, as shown in FIG. 7, a pair of housing substrates 30 for female connectors 11 may be mounted on an electroplating rack (not shown) so that the end surfaces of the input jack projections 27 are spaced apart from each other a short distance. In such an arrangment, the end surface of the input jack projection 27 of each female connector 11 "robs" current from the other. To prevent plating along the periphery of the end surfaces of the input jack projections 27, a "robber" which is part of the rack, e.g., in the form of an uncoated ring 76 which extends around and is spaced-apart from the periphery of the end surfaces of the input jack projections 27, may be used.

Once an electrolessly plated substrate is suitably mounted on an electroplating rack, the substrate is electrolytically plated by conventional techniques to build up a thick conductive coating over the electroless layer. The electrolytically deposited coating comprises at least a final metal layer and, in addition, may comprise one or more intermediate metal layers underlying the final metal layer.

One or more intermediate layers may be desired to impart selected physical, chemical or aesthetic properties to the coating. For example, copper has high conductivity relative to many other metals. Thus, an intermediate layer of copper may be desired to enhance the conductivity of the coating. Further, copper deposited for many commercially available electrolytic copper plating baths tends to exhibit higher ductility than most other metals. High ductility is a property generally found to be desirable for metal coatings on plastic substrates because of the difference in thermal expansion properties between the plastic substrate and the metal coating. An intermediate layer of copper may also be desirable if a bright, shiny finish is desired. This is because electroless deposits generally have a matte finish and deposits from many commercially available copper electroplating baths tend to level out and produce a bright, shiny finish over the electroless layer.

As another example, an intermediate layer of nickel may be desired. Electrolytically deposited nickel tends to exhibit greater corrosion resistance than most other metals. Nickel deposits from commercially available plating baths may also be obtained which exhibit other properties, e.g., conductivity, ductility and/or leveling properties, which may be desired.

The intermediate layers are deposited under conditions which assure that they extend over at least all of the first selected surfaces of the substrate. While not preferred, deposition may also occur over all or a portion of the second selected surfaces.

The metal of the final layer may be any metal different from the metal of the electroless layer and the metals of any intermediate layers which can be deposited from an electrolytic plating bath and which is resistant to a chemical stripping solution which dissolves the metals of the electroless layer and any intermediate electroplated layers. The final layer is deposited under conditions, e.g., voltage, which are adjusted so that deposition occurs over the first selected surfaces and not on the second selected surfaces.

Preferred metals of the final layers are those deposited from an electroplating bath having poor "throwing power". As used herein "throwing power" refers to the ability of an electroplating bath to deposit metal in low current density surfaces. Metals having poor "throwing power" are desired because the voltage of the electroplating bath from which the final metal is deposited, and hence the current density at which the final metal is deposited, is easily adjusted so that the final metal does not deposit on the second selected surfaces.

Presently preferred final metal layers include chromium and black chromium deposits. Such final metals are preferred for their ability to retain a bright, shiny finish over an extended period of time and because the electroplating bath from which they are deposited tend to exhibit poor "throwing power". Nickel deposits from nickel electroplating baths having poor "throwing power" are also preferred.

While preferred, chromium and black chromium deposits have a tendency to form gross cracks, particularly if the thickness of the deposit is about 15 mils or more. Accordingly, when chromium or black chromium is selected as the final metal layer, care must be taken to avoid such gross cracking in the final layer to prevent penetration of the stripping solution through the final layer where it can attack the underlying metal layers. Such gross cracking can be avoided or at least minimized by the use of an electroplating bath which produces microcracked or microporous deposits, as is well known in the art.

In a particularly preferred embodiment of the invention, the electrolessly plated substrate is electrolytically plated with intermediate metal layers of copper and nickel and then with a final layer of chromium or black chromium.

When such second selected surfaces are covered by a shield, whether in contact with the surface or closely spaced apart from the second selected surface, the "throwing power" of the bath is less important. In such instances, metals such as gold, copper, nickel and the like which are deposited from electroplating baths having good "throwing power" are also preferred.

Once the final metal layer has been electrolytically deposited, the contact housing is immersed in one or more stripping solutions. This may be done while still mounted on the electroplating rack or, more preferably, after removal from the electroplating rack. The stripping solution is selected to dissolve the electroless layer and any intermediate electroplated metal layers but not the final electroplated metal layer and without detrimentally affecting the plastic substrate. The contact housing is immersed for a time sufficient to dissolve the electroless layer and any intermediate metal layers covering the second selected surfaces. Immersion time is insufficient to dissolve the electroless and intermediate electrolytic layers underlying the final metal layer.

The composition of the stripping solution depends on the type of metals which are to be dissolved and on the type of plastic from which the contact housing is made. Exemplary stripping solutions for various metal deposits which may be suitable for use in the present invention, depending on the type of plastic from which the substrate is made, are disclosed in *Metal Finishing Guidebook and Directory*, published annually by Metals and Plastics Publications, Inc., Hackensack, N.J.

A presently preferred stripping solution for dissolving electroless and intermediate electrolytic metal layers of copper and nickel deposited on a plastic substrate made of ABS, polysulfone, polycarbonate or polyester without dissolving a final layer of chromium or black chromium comprises an aqueous solution of chromic acid and sulfuric acid. Another suitable stripping solution for copper and nickel electroless and electrolytic layers, but not for chromium layers, comprises sodium cyanide and nitrobenzoic acid. A preferred stripping solution, for polyester substrates having electroless and intermediate metal layers of copper and/or nickel with a final metal layer of chromium or black chromium, comprises an aqueous solution comprising nitric acid.

When the final metal layer comprises chromium, it has been found that some stripping solutions may leave a dark film over the surface of the chromium layer. In such a situation, if a bright chromium finish is desired, the chromium layer can be stripped off, for example, by immersion in a solution of hydrochloric acid and replated according to known techniques.

EXAMPLE

An electrical connector contact housing made of a polyester resin was electrolessly plated by first immersing the contact housing in a solution containing about 350 grams per liter (g/l) of chromic acid, about 239 cubic centimenters per liter (cc/l) of sulfuric acid at a temperature of about 185° F. Immersion was for three minutes and the bath was agitated by air agitation. The contact housing was then rinsed, immersed in a solution containing about 150 gr/l sodium hydroxide at about 200° F. The solution was agitated by air agitation and immersion time was about 7 minutes.

Following rinsing, the contact housing was then immersed in a solution containing about 325 gr/l of ammonium bifluoride and about 60 cc/l sulfuric acid at about 135° F. for about 5 minutes. The contact housing was rinsed and then immersed in a catalyst containing 2% PM958[1] at 120° F. for about 2-½ minutes. The solution was agitated mechanically.

[1] A proprietary catalyst composition sold by the Shipley Company of Newton, Mass.

Again, following rinsing the contact housing was immersed in a solution containing about 3% soda ash at about 100° F. for one minute, rinsed and then immersed in a PM954 electroless copper solution[2] maintained at about 90° F. and agitated by air agitation for about 4-½ minutes. A layer of copper metal was deposited over substantially all of the surface of the contact housing. The contact housing was then rinsed and immersed in an aqueous solution containing a surfactant to minimize oxidation of the electroless copper layer between electroless plating and electrolytic plating.

[2] A proprietary electroless copper plating bath sold by the Shipley Company of Newton, Mass.

The electrolessly plated contact housing was then racked on an electroplating rack in a manner generally as shown in FIG. 3.

Prior to electrolytic deposition, the contact housing was immersed for one minute in an alkaline soak cleaner containing about 7.5 g/l Northwest 471[3] maintained at about 135° F., rinsed and immersed for 30 seconds in a reverse current soak cleaner containing about 75 g/l Northwest 51[4] maintained at about 135° F. The contact housing was again rinsed and then immersed in an activating solution containing about 5% sulfuric acid for 15 seconds.

[3] A proprietary alkaline cleaner sold by McGean Chemical Co. of Cleveland Ohio.
[4] A proprietary reverse-current cleaner sold by McGean Chemical Co. of Cleveland, Ohio.

The contact housing was then immersed in an acid copper electroplating bath[5] containing about 195 gr/l copper sulfate, about 67 gr/l sulfuric acid and proprietary brighteners. The bath was maintained at about 70° F. and was air agitated. The voltage of the bath was maintained at about 1.7 volts and the contact housing was plated for about 10 minutes.

[5] 879 AC Copper Plating Bath marketed by MacDermid Inc. of Waterbury, Conn.

Following rinsing, the contact housing was immersed in a nickel plating bath containing about 11 ounces per gallon nickel as sulfate and chloride salts, about 49 g/l boric acid and a proprietary brightener[6]. The bath was maintained at about 135° F. and an agitation was used. The contact housing was plated for about 7 minutes at about 1.5 volts.

[6] Zodiac 100 brightener sold by the Harshaw Chemical Co. of Cleveland, Ohio.

The contact housing was then rinsed and immersed for about 2 minutes in a chromium plating solution containing about 33 ounces per gallon chromic acid and a mixed sulfate and fluoride catalyst. The bath was maintained at about 110° F. and the contact housing was plated at about 5.1 volts.

The plated contact housing was then rinsed and removed from the electroplating rack and immersed for about 2-½ minutes in a stripping solution containing about 3.3 pounds per gallon chromic acid and about 185 cc/l sulfuric acid at about 135° F. The contact housing was then rinsed and dried. The plated conductive coating extended over the entire exterior of the part with the exception that the pin plate, pin holes and interior surfaces of the contact housing had no coating.

The preceding description has been presented with reference to presently preferred embodiments of the invention. Workers skilled in the art and technology to which this invention pertains will appreciate that alterations and changes in the described techniques, compositions and applications can be practiced without meaningfully departing from the principles, spirit and scope of this invention.

For example, it is apparent that the process of the present invention can be used to selectively plate any platable plastic substrate, not merely electrical connectors. If used to provide a conductive shielding for electrical connectors, it is apparent that the contact housing of the connector may be of any shape and design, not merely those shown in the drawings.

Accordingly, the foregoing description should not be read as pertaining only to the precise techniques, compositions and applications described, but rather should be read consistent with and as support for the following claims which are to have their fullest, fair scope.

What is claimed is:

1. A method for selectively plating a platable nonconductive plastic substrate to provide a conductive coating over first selected surfaces of the substrate and no conductive coating over second selected surfaces of the substrate comprising:
   plating the substrate in an electroless plating process wherein a first metal is deposited over substantially all of the first selected surfaces and at least a portion of the second selected surfaces;
   mounting the electrolessly plated substrate on an electroplating rack so that the current density at the second selected surfaces is lower during subsequent electroplating than at the first selected surfaces;
   electroplating the electrolessly plated substrate with a second metal different from the first metal under conditions where the second metal deposits over the first selected surfaces but not over the second selected surfaces; and
   immersing the electroplated substrate in a stripping solution capable of dissolving the first metal but not the second metal for a time sufficient to dissolve substantially all of the first metal deposited over the second selected surfaces.

2. A method as claimed in claim 1 wherein the first metal is selected from the group consisting of nickel and copper.

3. A method as claimed in claim 2 wherein the second metal is selected from the group consisting of chromium and black chromium.

4. A method as claimed in claim 3 wherein the stripping solution comprises chromic acid and sulfuric acid.

5. A method as claimed in claim 1 further comprising, prior to electroplating the substrate with the second metal, electroplating the substrate with at least one intermediate metal layer different from the second metal, under conditions whereby the intermediate metal is deposited over at least all of the first selected surfaces, to provide at least one intermediate metal layer between the first metal layer and the second metal layer, and wherein the stripping solution is capable of dissolving the first metal and the intermediate metal but not the second metal.

6. A method as claimed in claim 5 wherein the intermediate metal is selected from the group consisting of copper and nickel.

7. A method for selectively plating a platable nonconductive substrate to provide a conductive coating over first selected surfaces of the substrate but not over second selected surfaces of the substrate comprising:
- electrolessly plating the substrate with a first metal whereby the first metal is electrolessly deposited over substantially all of the first selected surfaces and at least a portion of the second selected surfaces;
- mounting the electrolessly plated substrate on an electroplating rack so that, during subsequent electroplating, the current density at the second selected surfaces is lower than at the first selected surfaces;
- electroplating the substrate with at least one intermediate metal under conditions whereby the intermediate metal is deposited over at least substantially all of the first selected surfaces;
- electroplating the substrate with a final metal at a voltage whereby the current density at the first selected surfaces is sufficiently high for the final metal to be deposited over substantially all of the first selected surfaces but is sufficiently low at the second selected surfaces that the final metal does not deposit over the second selected surfaces; and
- immersing the electroplated substrate in a stripping solution capable of dissolving the first metal and intermediate metal but not the final metal, for a time sufficient to dissolve substantially all of the first metal and intermediate metal deposited over the second selected surfaces.

8. A method as claimed in claim 7 wherein the first metal is selected from the group consisting of copper and nickel.

9. A method as claimed in claim 7 wherein the intermediate metal is selected from the group consisting of copper and nickel.

10. A method as claimed in claim 7 wherein the final metal is selected from the group consisting of chromium and black chromium.

11. A method as claimed in claim 7 wherein the first and intermediate metals are selected from the group consisting of copper and nickel and the final metal is selected from the group consisting of chromium and black chromium.

12. A method as claimed in claim 11 wherein the stripping solution comprises chromic acid and sulfuric acid.

13. A method for selectively plating a platable nonconductive substrate to provide a conductive coating over first selected surfaces of the substrate but not over second selected surfaces of the substrate comprising:
- electrolessly plating the substrate with a first metal in a first metal electroless plating solution whereby the first metal is electrolessly deposited over substantially all of the first selected surfaces and at least a portion of the second selected surfaces;
- positioning at least one shield adjacent the substrate so that during subsequent electrolytic deposition, the current density at the second selected surfaces is lower than at the first selected surfaces of the substrate;
- electrolytically plating the substrate with a second metal in a second metal electrolytic plating solution under conditions whereby the second metal is electrolytically deposited over at least substantially all of the first selected surfaces;
- electrolytically plating the substrate with a third metal in a third metal electrolytic plating solution under conditions wherein the current is adjusted so that the third metal is electrolytically deposited over substantially all of the first selected surfaces but is not depostied over the second selected surfaces; and
- immersing the plated substrate in a stripping solution capable of dissolving the first and second metals but not the third metal, for a time sufficient to dissolve substantially all of the first and second metals deposited over the second selected surfaces.

14. A method as claimed in claim 13 wherein the first metal is selected from the group consisting of copper and nickel.

15. A method as claimed in claim 13 wherein the second metal is selected from the group consisting of copper and nickel.

16. A method as claimed in claim 13 wherein the third metal is selected from the group consisting of chromium and black chromium.

17. A method as claimed in claim 13 wherein the first and second metals are selected from the group consisting of copper and nickel and the third metal is selected from the group consisting of chromium and black chromium.

18. A method as claimed in claim 17 wherein the stripping solution comprises chromic acid and sulfuric acid.

19. A method for selectively plating a platable nonconductive substrate to provide a conductive coating over first selected surfaces of the substrate but not over second selected surfaces of the substrate comprising:
- electrolessly plating the substrate with a first metal selected from the group consisting of copper and nickel in a first metal electroless plating solution whereby the first metal is electrolessly deposited over substantially all of the first selected surfaces and at least a portion of the second selected surfaces;
- mounting the electrolessly plated substrate on an electroplating rack so that the current density at the second selected surfaces of the substrate is lower during subsequent electroplating than at the first selected surfaces of the substrate;
- electroplating the substrate with copper in a copper electroplating solution under conditions whereby the copper is electrolytically deposited over at least substantially all of the first selected surfaces;
- electroplating the substrate with nickel in a nickel electroplating solution under conditions whereby the nickel is deposited over at least substantially all of the first selected surfaces;
- electroplating the substrate with chromium in a chromium electroplating solution at a voltage whereby the chromium is electrolytically deposited over substantially all of the first selected surfaces but is not deposited over the second selected surfaces; and
- immersing the electrolytically plated substrate in a stripping solution comprising chromic acid and sulfuric acid for a time sufficient to dissolve substantially all of the copper and nickel deposited on the second selected surfaces.

* * * * *